(12) United States Patent  
Narayanan et al.

(10) Patent No.: US 9,742,420 B2
(45) Date of Patent: Aug. 22, 2017

(54) BASELINE COMPENSATION SYSTEM

(71) Applicant: TEXAS INSTRUMENTS INCORPORATED, Dallas, TX (US)

(72) Inventors: Sriram Narayanan, Richardson, TX (US); Srinath Ramaswamy, Murphy, TX (US); Arup Polley, Richardson, TX (US); Ajit Sharma, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/954,577

(22) Filed: Nov. 30, 2015

(65) Prior Publication Data

US 2017/0155398 A1 Jun. 1, 2017

(51) Int. Cl.
*H03M 1/00* (2006.01)
*H03M 1/06* (2006.01)

(52) U.S. Cl.
CPC ......... *H03M 1/0609* (2013.01); *H03M 1/001* (2013.01); *H03M 1/002* (2013.01)

(58) Field of Classification Search
CPC ..... H03M 1/0609; H03M 1/001; H03M 1/002
USPC .......................... 341/110, 126, 139, 155, 156
See application file for complete search history.

(56) References Cited

U.S. PATENT DOCUMENTS

| | | | | |
|---|---|---|---|---|
| 5,262,635 A | * | 11/1993 | Curbelo | G01N 21/274 250/214 A |
| 6,553,242 B1 | * | 4/2003 | Sarussi | A61B 5/0261 600/323 |
| 7,171,251 B2 | * | 1/2007 | Sarussi | A61B 5/0261 600/324 |
| 9,078,609 B2 | * | 7/2015 | Addison | A61B 5/14551 600/322 |
| 9,083,369 B2 | * | 7/2015 | Coln | H03M 1/121 341/155 |

* cited by examiner

*Primary Examiner* — Khai M Nguyen
(74) *Attorney, Agent, or Firm* — John R. Pessetto; Charles A. Brill; Frank D. Cimino

(57) ABSTRACT

An analog to digital converter (ADC) system that includes a first amplifier configured to amplify an analog input signal to produce an amplified direct current (DC) signal, an ADC configured to receive the amplified DC signal and convert the amplified DC signal into a digital DC signal, a digital to analog converter configured to receive the digital DC signal and convert the digital DC signal into an analog DC signal, and a second amplifier configured to receive an analog alternating current (AC) signal comprising the analog DC signal subtracted from the analog input signal and amplify the analog AC signal to produce an amplified AC signal. The ADC is further configured to receive the amplified AC signal and produce a digital AC signal. The second amplifier has a gain greater than a gain of the first amplifier.

20 Claims, 2 Drawing Sheets

BASELINE COMPENSATION SYSTEM

BACKGROUND

Many signals have a structure composed of two components: a direct current (DC) offset (i.e., baseline) that may drift (i.e., vary over time) and an alternating current (AC) component superimposed on the DC baseline. For example, in photo-plethysmography, transmitted light is reflected off the body of a user and received by a light detector. The received signal includes an AC component that is a function of pulsating arterial blood (i.e., heartrate) of the user and a DC component (i.e., baseline) which may be a function of ambient light measurements or body tissue that is not pulsating. This DC component may drift over time. In some instances, the drift in the DC component may include periods of large swings. Because the received signals are analog, they are converted to digital signals utilizing an analog to digital converter (ADC) for processing. In order to maximize signal swing and increase the signal to noise ratio (SNR), many systems amplify the signal by maximizing the gain prior to the digital conversion. Thus, even a small DC component becomes much larger at the input of the ADC. To accommodate this large DC component and/or potential drift in the DC component, some systems utilize a large dynamic range ADC. Alternatively, some systems lower the gain in the amplification of the signal to reduce the DC component at the input of the ADC. However, this also reduces the SNR making the digital conversion less accurate.

SUMMARY

The problems noted above are solved in large part by systems and methods for compensating for direct current baseline in a signal. In some embodiments, an analog to digital converter (ADC) system includes a first amplifier configured to amplify an analog input signal to produce an amplified direct current (DC) signal, an ADC configured to receive the amplified DC signal and convert the amplified DC signal into a digital DC signal, a digital to analog converter configured to receive the digital DC signal and convert the digital DC signal into an analog DC signal, and a second amplifier configured to receive an analog alternating current (AC) signal comprising the analog DC signal subtracted from the analog input signal and amplify the analog AC signal to produce an amplified AC signal. The ADC is further configured to receive the amplified AC signal and produce a digital AC signal. The second amplifier has a gain greater than a gain of the first amplifier.

Another illustrative embodiment is a method that may comprise amplifying, by a first gain factor, an analog input signal to produce an amplified analog DC signal. The analog input signal may comprise an analog DC signal and an analog AC signal. The method may also comprise subtracting the analog DC signal from the analog input signal to produce the analog AC signal. The method may also comprise amplifying the analog AC signal by a second gain factor that is greater than the first gain factor to produce an amplified analog AC signal. The method may also comprise converting, by an analog to digital converter (ADC), the amplified analog AC signal to produce a digital AC signal.

Yet another illustrative embodiment is a system comprising a signal detection device and an ADC system. The signal detection device is configured to detect an optical input signal and convert the optical input signal into an electrical analog input signal. The analog input signal includes an analog DC signal and an analog AC signal. The ADC system is configured to receive the analog input signal. The ADC system includes a first channel, an ADC, and a second channel. The first channel is configured to receive the analog input signal and output an amplified analog DC signal. The amplified analog DC signal comprises the analog DC signal after being amplified by a first gain factor. The ADC is configured to receive from the first channel the amplified analog DC signal and convert the amplified analog DC signal into an amplified digital DC signal. The second channel is configured to receive the analog AC signal and output an amplified analog AC signal. The analog AC signal comprises the analog DC signal subtracted from the analog input signal. The analog amplified AC signal comprises the analog AC signal after being amplified by a second gain factor. The ADC is further configured to convert the amplified analog AC signal into a digital AC signal.

BRIEF DESCRIPTION OF THE DRAWINGS

For a detailed description of various examples, reference will now be made to the accompanying drawings in which.

NOTATION AND NOMENCLATURE

Figure 1:
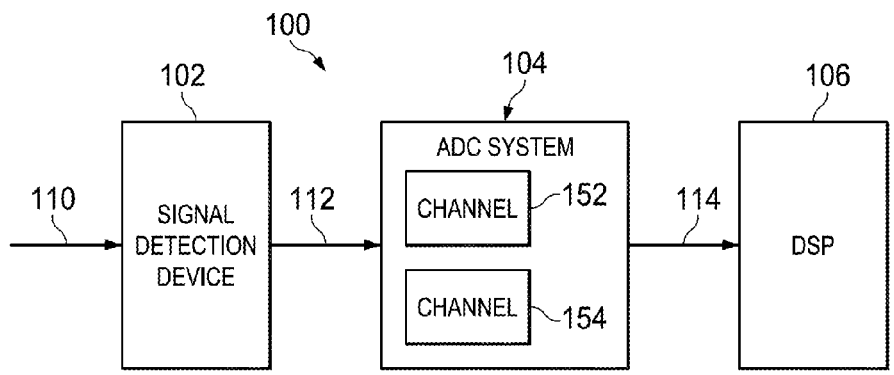
FIG. 1 shows a block diagram of a digital signal processing system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Analog signals may contain two components: a direct current (DC) component (i.e., baseline) that may drift (i.e., vary over time) and an alternating current (AC) component superimposed on the DC component. In many applications, only the AC component is required for processing. For example, in photo-plethysmography (PPG) transmitted light is reflected off the body of a user and received by a light detector. The received signal includes an AC component that is a function of pulsating arterial blood (i.e., heartrate) of the user and a DC component which may be a function of ambient light measurements or body tissue that is not pulsating. Processing of the AC component may provide valuable information about the user (e.g., heartrate, breathing, and other circulatory conditions). However, the DC component is not required for processing.

Because the received signals are analog, they must be converted to digital signals utilizing an analog to digital converter (ADC) for further processing. In order to maximize signal swing and increase the signal to noise ratio (SNR), many conventional systems amplify the signal maximizing the gain prior to the digital conversion. Thus, even a small DC component becomes much larger at the input of the ADC. To accommodate this large DC component and/or potential drift in the DC component, some conventional systems utilize a large dynamic range ADC. However, large dynamic range ADC's have a higher cost, are more difficult to design, and increase power consumption. With a small dynamic range ADC, signal saturation may occur, especially with a drifting DC component, thus, degrading the system. Alternatively, some conventional systems lower the gain in the amplification of the signal to reduce the DC component at the input of the ADC. However, this also reduces the SNR making the digital conversion less accurate. Therefore, there is a need to reduce the dynamic range of the ADC while maintaining a high SNR.

In accordance with the disclosed principles, by utilizing two channels, the dynamic range of the ADC may be reduced without sacrificing SNR. The system may receive an analog input signal (i.e., a continuous time and continuous amplitude signal) that is made up of two components: an AC component and a DC component. This analog input signal then may enter a first low gain saturation free channel. In this channel, the analog input signal is amplified by a relatively low gain factor which produces insufficient signal swing and/or resolution for the AC component to be digitized, but provides sufficient boost of the DC component to be adequately digitized within the resolution of the ADC. That is, the DC component is amplified sufficiently for adequate analog to digital conversion given the resolution of the ADC, but the dynamic range of the AC component, while amplified slightly, remains still too small relative to the resolution of the ADC. Thus, in effect, only the DC component is amplified. This amplified DC component then may be digitized utilizing the ADC. The slightly amplified and digitized DC component then may be converted back into an analog signal (e.g., by a digital to analog converter) and corrected, based on the gain factor provided during the low gain amplification, to produce an analog representation of the DC component of the original analog input signal. This signal then may be subtracted from the analog input signal leaving substantially only the original analog AC component. As such, the DC component of the analog input signal is removed.

The analog AC component (without any or much of the DC component) may enter a second high gain saturation prone channel. This amplification has a gain factor that is sufficient to provide the signal swing and resolution that allows for the AC component to be digitized. Thus, only the AC component is amplified in the high gain channel. Once the AC component is digitized, it may be provided to a processor (e.g., a digital signal processor (DSP)) for processing (e.g., to determine the heartrate of a subject in the context of photo-plethysmography). Because the ADC digitizes a signal that is predominantly just the AC component and has only a low gain (i.e., smaller) DC component, it does not need to have the dynamic range required in the conventional system to accommodate DC component drift. Furthermore, SNR is not compromised because the AC component is amplified in the high gain channel. Thus, a lower dynamic range ADC may be incorporated into the system at no cost to SNR.

Figure 2:
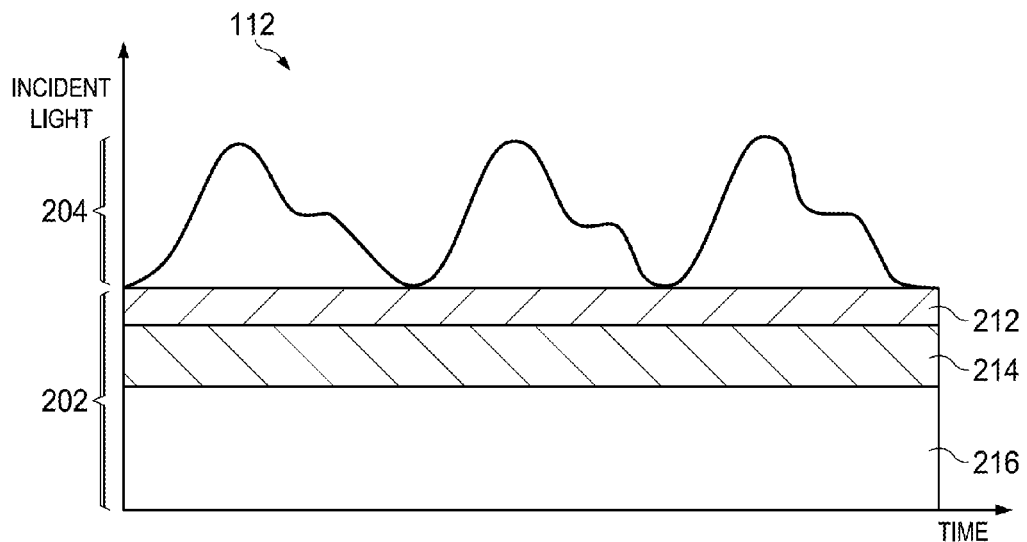
FIG. 2 shows an exemplary signal containing a direct current component and an alternating current component in accordance with various embodiments.

FIG. 1 shows a block diagram of a DSP system 100 in accordance with various embodiments. DSP system 100 may include a signal detection device 102, an ADC system 104 and a DSP 106 (although non-DSP processor may be used as well). The signal detection device 102 is configured to receive and, in some cases, detect optical input signal 110. The signal detection device 102 then may convert the optical input signal into a corresponding electrical analog input signal 112. For example, the signal detection device 102 may, in an embodiment, be a photodiode that receives optical input signal 110 (i.e., absorbs photons of light found in the optical input signal 110) and converts the optical input signal 110 into an electrical signal that forms analog input signal 112. Analog input signal 112 may include an AC component superimposed on a DC component. For example, FIG. 2 shows an exemplary analog input signal 112 containing a DC component 202 and an AC component 204 in accordance with various embodiments. In this example, the analog input signal 112 is a PPG signal; however, in other examples analog input signal 112 may be other types of signals that include a DC component and an AC component (e.g., a differential signal without reference to ground). In some examples, light is transmitted by a light emitting diode (LED) and reflected off an object such as a person's body. During this process, some of the light is absorbed by the object that the light is reflected off, while the remaining light, as optical input signal 110, is received by signal detection device 102 (e.g., a photodiode). For example, blood and other tissues within a body absorb certain wavelengths of light. Therefore, the received optical input signal 110 may be a function of pulsating arterial blood, non-pulsating arterial blood, venous blood, and other tissues. Hence, the analog input signal 112 also may be a function of pulsating arterial blood, non-pulsating arterial blood, venous blood, and other tissues.

Because the absorption of light by non-pulsating arterial blood (absorption shown as electrical signal 212), venous blood (absorption shown as electrical signal 214), and other tissues (absorption shown as electrical signal 216) remain comparatively constant, those may comprise the components of the DC component 202 of analog input signal 112. Other components such as ambient light may also comprise components of the DC component 202. While the DC component 202 maintains a comparatively constant amplitude, the amplitude may drift up and down (i.e., vary over time) due to outside factors. For example, if a user reflects light off the arm of the user's body, the DC component 202 may maintain constant amplitude while the arm stays in one position and the ambient light does not change. However, if the arm moves, then gravitational forces may cause the volumes of the non-pulsating blood and venous blood to change at the location of the reflected light in the arm. Additionally, the ambient light might change due to the movement of the arm. This may cause the amplitude of the DC component 202 to drift.

Because the volume in pulsating arterial blood fluctuates, in some cases due to the heart pumping, the absorption of light varies in a regular pattern. Thus, the amplitude of the portion of the analog input signal 112 caused by the pulsating arterial blood is a periodic signal and can be loosely approximated as sinusoidal. This portion of the analog input signal 112 makes up the AC component 204. By analyzing the peaks of the AC component 204, the heartrate of a person may be determined.

Returning to FIG. 1, ADC system 104 is configured to receive the analog input signal 112 from the signal detection device 102. Because the analog input signal 112, and its components, DC component 202 and AC component 204, are analog signals, ADC system 104 is configured, in an embodiment, to digitize the AC component 204 to produce a digital AC signal 114 for processing by DSP 106. Thus, the ADC system 104 may transmit the digital AC signal 114 to the DSP 106. In alternative embodiments, ADC system 104 may be configured to digitize the entire analog input signal 112. DSP 106 may be any type of processor and/or microprocessor with an architecture optimized for processing the digital AC signal 114. For example, DSP 106 may be a microprocessor configured to perform calculations to determine a heartrate based on the received digital AC signal 114.

Figure 3:
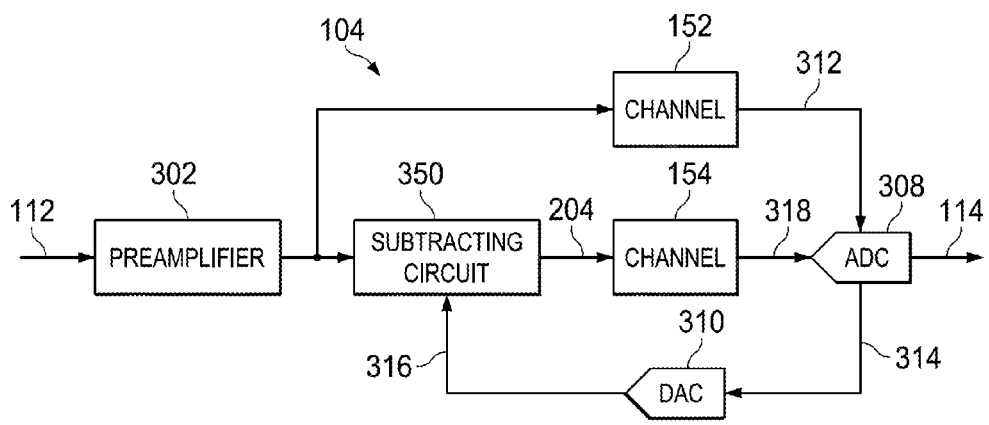
FIG. 3 shows a block diagram of an analog to digital converter system in accordance with various embodiments.

ADC system 104 may include channels 152 and 154 to enable the ADC system 104 to generate the digital AC signal 114. For example, FIG. 3 shows an illustrative block diagram of ADC system 104 in accordance with various embodiments. ADC system 104 may include channels 152 and 154, ADC 308, digital to analog converter (DAC) 310, subtracting circuit 350 and preamplifier 302. In some embodiments, the channels 152 and 154 are in parallel with one another. The ADC system 104 receives the analog input signal 112. In an embodiment, preamplifier 302 receives the analog input signal 112 and amplifies the signal in preparation for further amplification. In alternative embodiments, a preamplifier is not included and the analog input signal 112 is received in the first channel 152.

The channel 152 is a saturation free low gain amplification channel. More particularly, channel 152 receives the analog input signal 112 and amplifies the analog input signal 112 by a gain factor that is low enough such that the drift of the DC component 202 is amplified. However, the gain is set to be low enough that there is too little resolution to identify the AC component 204 from the DC component 202 during digitization. Therefore, output of the channel 152 is substantially equivalent to an amplified analog DC signal, shown as amplified analog DC signal 312. In other words, the resolution provided in the amplification in channel 152 is too low to provide sufficient signal swing of the AC component 204 relative to the resolution of ADC 208. Thus, the output of channel 152 is substantially equivalent to an amplified DC component 202 solely.

ADC 308 then may receive the amplified analog DC signal 312 from the channel 152. The ADC 308 may be configured to digitize the amplified analog DC signal 312 and output an amplified digital DC signal 314. In other words, ADC 308 receives the amplified analog DC signal 312 and converts that signal into a digital representation of the amplified analog DC signal (i.e., amplified digital DC signal 314). Because the gain in channel 152 is relatively low, ADC 308 the amplified digital DC signal 314 is unsaturated. DAC 310 then may receive the amplified digital DC signal 314 from ADC 308 and convert the amplified digital DC signal 314 into an analog DC signal 316 which is substantially equivalent to the DC component 202 of the analog input signal 112. For example, the DAC 310 receives the amplified digital DC signal 314 which is a digital representation of the amplified analog DC signal 312. The DAC 310 then converts the amplified digital DC signal 314 into an analog signal. The DAC 310 also may offset the converted analog signal based on the gain factor in channel 152. In other words, because the gain of the amplification provided to the DC component 202 in the channel 152 is known, the DAC 310 may offset the analog signal representative of the amplified digital DC signal 314 by a factor substantially equivalent to the gain provided to the DC component 202 in channel 152. Therefore, the output of the DAC 310 is substantially equivalent to the analog DC component 202.

The analog DC signal 316, which is substantially equivalent to analog DC component 202, then may be subtracted from the analog input signal 112 by subtracting circuit 350. Subtracting circuit 350 may be any hardware or software circuit that is capable of subtracting one analog signal from another analog signal. In alternative embodiments, instead of subtracting circuit 350, DAC 310 may generate a substantial equivalent to the negative of the analog DC component 202 which is then wire added to the analog input signal 112. This leaves the AC component 204 as the input for channel 154. The channel 154 is a saturation prone high gain amplification channel. The higher gain nature of channel 154 compared to channel 152), which is needed to adequately digitize the AC component 204 given the resolution of the ADC 308, may saturate a DC component of the analog input signal 112. However, because the unsaturated DC component 202 (i.e., analog DC signal 316) has been subtracted from the analog input signal 112 prior to being received in channel 154, only the analog AC component 204 is received in channel 154. More particularly, channel 154 receives the analog AC component 204 and amplifies the analog AC component 204 by a gain factor that is high enough to provide sufficient swing and resolution for the ADC 308 to convert the output into a digital signal. In some embodiments, the gain provided in channel 154 is greater than the gain provided in channel 152. While channel 154 is saturation prone, the DC component has been removed from the signal prior to entering channel 154; therefore, it is immaterial that the channel is saturation prone. The output of channel 154 is amplified analog AC signal 318.

Amplified analog AC signal 318 is received by ADC 308 which is configured to convert the amplified analog AC signal 318 into a digital signal, such as digital AC signal 114. In other words, ADC 308 may convert the amplified analog AC signal 318 into a digital representation of itself. The digital AC signal 114 then may be received by DSP 106 for further processing. While ADC 308 is shown in FIG. 3 as a single ADC that receives both the amplified analog DC signal 312 and the amplified analog AC signal 318, in alternative embodiments, a separate ADC may be utilized to digitize each of these signals. Furthermore, in some embodiments, an analog multiplexer (not shown) may receive both the DC signal 312 and the amplified analog AC signal 318 prior to entering the ADC 308. The multiplexer then may allow one signal (either the DC signal 312 or the amplified analog AC signal 318) to enter the ADC 308 at a time for digital conversion. Serial implementation is alternatively utilized in high gain and low gain settings. Thus, less hardware is required (i.e., a multiplexer is not required).

Figure 4:
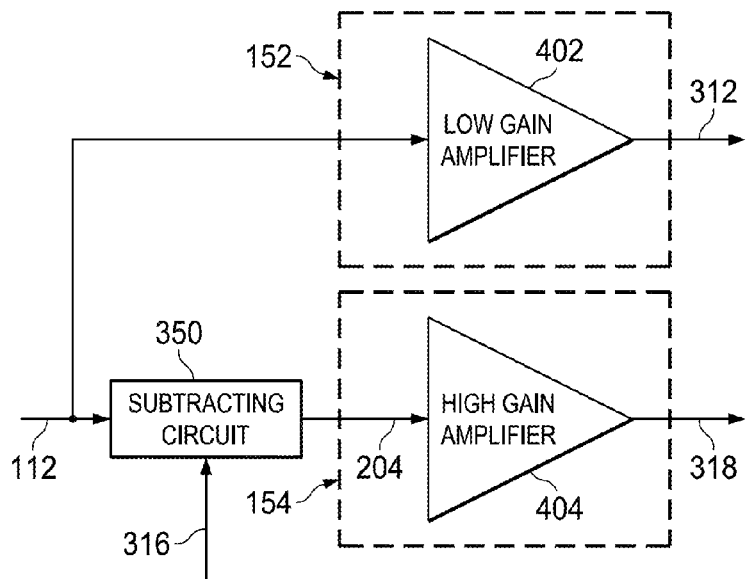
FIG. 4 shows a block diagram of two channels of an analog to digital converter system in accordance with various embodiments.

FIG. 4 shows a block diagram of two channels 152 and 154 of ADC system 104 in accordance with various embodiments. As discussed previously, channel 152 is a saturation free low gain amplification channel that may receive the analog input signal 112. Channel 152 may include low gain amplifier 402. Low gain amplifier 402 may be any type of signal amplifier that increases the power of the analog input signal 112. However, low gain amplifier 402 amplifies the analog input signal 112 by a gain factor that is low enough such that there is too little resolution to identify the AC component 204 from the DC component 202. For example, low gain amplifier 152 has a gain factor that provides amplification of the analog input signal 112 such that there is insufficient signal swing for AC component 204 to be digitized by ADC 308. Therefore, only the unsaturated DC component 202 is effectively amplified. Hence, the output of low gain amplifier 402 is amplified DC signal 312 which is provided to ADC 308 for digitization.

As discussed previously, channel 154 is a high gain saturation prone amplification channel that receives the analog AC component 204 for amplification. It receives the analog AC component 204 because the analog DC signal 316, which is substantially equivalent to the DC component 202 of the analog input signal 112, is subtracted from the analog input signal 112, in some embodiments by subtracting circuit 350. Channel 154 may include high gain amplifier 404. High gain amplifier 404 may be any type of signal amplifier that increases the power of the AC component 204. The gain factor of high gain amplifier 404 is high enough to provide sufficient signal swing and resolution such that the AC component 204 may be digitized by ADC 308. In some embodiments, the gain factor of high gain amplifier 404 is greater than the gain factor of low gain amplifier 402. The output of high gain amplifier 404 is amplified AC signal 318 which is provided to ADC 308 for amplification.

In some embodiments, low gain amplifier 402 and high gain amplifier 404 may be formed by a single piece of hardware utilizing time multiplexing. For example, during a first period of time, the single piece of hardware may act as low gain amplifier 402 and provide a comparatively low gain factor to the analog input signal 112. During a second period of time, the single piece of hardware may act as high gain amplifier 404 and provide a comparatively high gain factor to the analog AC component 204. Thus, the gain factor of the single piece of hardware that makes up low gain amplifier 402 and high gain amplifier 404 in this example is adjusted between the channel sample times. In alternative embodiments, the low gain amplifier 402 and high gain amplifier 404 may be formed by two separate pieces of hardware.

Figure 5:
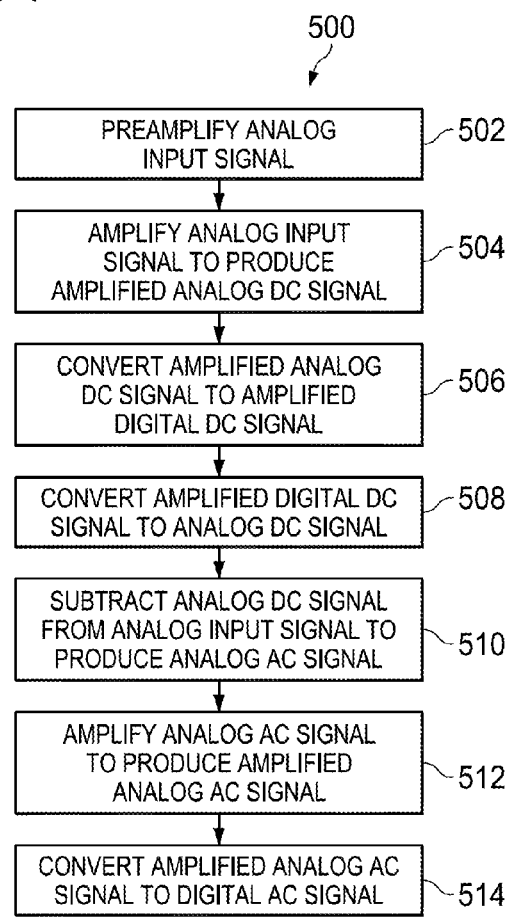
FIG. 5 shows a flow diagram of a method for compensating for baseline DC component in accordance with various embodiments.

FIG. 5 shows a flow diagram of a method 500 for compensating for baseline DC component 204 in accordance with various embodiments. Though depicted sequentially as a matter of convenience, at least some of the actions shown in method 500 can be performed in a different order and/or performed in parallel. Additionally, some embodiments may perform only some of the actions shown or may perform additional actions. In some embodiments, at least some of the operations of the method 500, as well as other operations described herein, can be performed by the ADC system 104 implemented by a processor executing instructions stored in a non-transitory computer readable storage medium or a state machine.

The method 500 begins in block 502 with pre-amplifying an analog input signal, such as analog input signal 112. The analog input signal may be comprised of an analog DC component, such as analog DC component 202, and an analog AC component, such as analog AC component 204. In some embodiments, block 502 may not be performed. In block 504, the method 500 continues with amplifying the analog input signal, or the pre-amplified analog input signal, to produce an amplified analog DC signal, such as amplified analog DC signal 312. The amplification of the analog input signal may occur in channel 152 utilizing amplifier 402. Thus, the amplification of the analog input signal in block 504 may be a comparatively low gain amplification. Because the amplification in block 504 is a comparatively low gain amplification, the AC component of the analog input signal has insufficient signal swing to be converted by an ADC. In other words, the resolution of the AC component after the low gain amplification is too low for digitization. Thus, the resulting signal is in effect the amplified DC component of the analog input signal.

The method 500 continues in block 506 with converting the amplified DC signal to an amplified digital signal, such as amplified digital signal 314. More specifically, ADC 308 may digitize the analog amplified DC signal producing an amplified digital DC signal. Because the amplification in block 504 is a comparatively low gain amplification, the resulting amplified digital DC signal may be unsaturated. In block 508, the method 500 continues with converting the amplified digital DC signal to an analog DC signal, such as analog DC signal 316. More specifically, DAC 310 may convert the digital signal produced by the ADC 308 into an analog signal. In some embodiments, the resulting analog signal (e.g., analog DC signal 316) has a correction factor that is related to the gain factor of the amplification in block 504. In other words, the resulting analog DC signal is substantially equivalent to the DC component of the analog input signal.

The method 500 continues in block 510 with subtracting the analog DC signal from the analog input signal to produce the analog AC component, such as AC component 204, of the analog input signal. In block 512, the method 500 continues with amplifying the analog AC signal to produce an amplified analog AC signal, such as amplified analog AC signal 318. The amplification of the analog AC signal may occur in channel 154 utilizing amplifier 404. Thus, the amplification of the analog AC signal in block 512 may be a comparatively high gain amplification. In some embodiments, the amplification of the analog AC signal in block 512 has a gain factor greater than the gain factor of the amplification of the analog input signal in block 504. Because the amplification in block 512 is a comparatively high gain amplification, the analog AC component has sufficient signal swing to be converted by an ADC. In other words, the resolution of the AC component after the high gain amplification is high enough for digitization. The method 500 continues in block 514 with converting the amplified AC signal into a digital AC signal, such as digital AC signal 114. More specifically, ADC 308 may digitize the analog amplified AC signal to produce the digital AC signal.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog to digital converter (ADC) system, comprising:

a first amplifier configured to amplify an analog input signal to produce an analog amplified direct current (DC) signal;

an ADC configured to receive the analog amplified DC signal and convert the analog amplified DC signal into a digital DC signal;

a digital to analog converter (DAC) configured to receive the digital DC signal and convert the digital DC signal into an analog DC signal; and a second amplifier having a gain greater than a gain of the first amplifier, the second amplifier configured to receive an analog alternating current (AC) signal, the analog AC signal comprising the analog DC signal subtracted from the analog input signal, and amplify the analog AC signal to produce an amplified AC signal;

wherein the ADC is further configured to receive the amplified AC signal and produce a digital AC signal.

2. The ADC system of claim 1, further comprising a subtracting circuit configured to subtract the analog DC signal from the analog input signal.

3. The ADC system of claim 1, wherein the ADC is further configured to transmit the digital AC signal to a digital signal processor (DSP).

4. The ADC system of claim 1, wherein the analog input signal is a photo-plethysmography (PPG) signal.

5. The ADC system of claim 1, wherein the first amplifier is further configured to receive the analog input signal from signal detection device.

6. The ADC system of claim 5, wherein the signal detection device is a photodiode.

7. The ADC system of claim 1, wherein the analog input signal is a differential signal without reference to ground.

8. The ADC system of claim 1, further comprising a preamplifier coupled to the first and second amplifiers, the preamplifier configured to receive the analog input signal and output an amplified analog input signal to be received by the first amplifier.

9. The ADC system of claim 1, wherein the analog input signal comprises the analog AC signal and the analog DC signal.

10. A method comprising:
amplifying, by a first gain factor, an analog input signal comprising an analog direct current (DC) signal and an analog alternating current (AC) signal to produce an amplified analog DC signal;

subtracting the analog DC signal from the analog input signal to produce the analog AC signal;

amplifying the analog AC signal by a second gain factor to produce an amplified analog AC signal, the second gain factor greater than first gain factor; and converting, by an analog-to-digital converter (ADC), the amplified analog AC signal to produce a digital AC signal.

11. The method of claim 10, further comprising:
converting, by the ADC, the amplified analog DC signal to produce an amplified digital DC signal; and converting, by a digital-to-analog converter (DAC), the amplified digital DC signal to produce the analog DC signal, an offset of the DAC being based on the first gain factor.

12. The method of claim 10, wherein the amplified analog DC signal is an unsaturated signal.

13. The method of claim 10, further comprising preamplifying the analog input signal to produce an amplified analog input signal to be received by the first amplifier.

14. The method of claim 10, wherein the amplifying by a first gain factor is by a first amplifier and the amplifying by a second gain factor is by a second amplifier.

15. The method of claim 10, wherein the amplifying by a first gain factor and amplifying by a second gain factor is by a single amplifier applying the first gain factor during a first period of time and applying the second gain factor during a second period of time.

16. A system, comprising:
a signal detection device configured to detect an optical input signal and convert the optical input signal into an electrical analog input signal, the analog input signal including an analog direct current (DC) signal and an analog alternating current (AC) signal; and an analog-to-digital converter (ADC) system configured to receive the analog input signal, the ADC system including:
a first channel configured to receive the analog input signal and to output an amplified analog DC signal, the amplified analog DC signal comprising the analog DC signal after being amplified by a first gain factor;

an ADC configured to receive from the first channel the amplified analog DC signal and convert the amplified analog DC signal into an amplified digital DC signal; and a second channel configured to receive the analog AC signal and output an amplified analog AC signal, the analog AC signal comprising the analog DC signal subtracted from the analog input signal and the analog amplified AC signal comprising the analog AC signal after being amplified by a second gain factor;

wherein the ADC is further configured to convert the amplified analog AC signal into a digital AC signal.

17. The system of claim 16, wherein the second gain factor is greater than the first gain factor.

18. The system of claim 16, wherein an amplifier amplifies the analog DC signal applying the first gain factor during a first period of time and the analog AC signal applying the second gain factor during a second period of time.

19. The system of claim 16, wherein a first amplifier amplifies the analog DC signal applying the first gain factor and a second amplifier amplifies the analog AC signal applying the second gain factor.

20. The system of claim 16, wherein the analog input signal is a photo-plethysmography (PPG) signal.

* * * * *